(12) United States Patent
Sheu et al.

(10) Patent No.: US 8,294,263 B2
(45) Date of Patent: *Oct. 23, 2012

(54) LIGHT-EMITTING DIODE PACKAGING STRUCTURE AND MODULE AND ASSEMBLING METHOD THEREOF

(75) Inventors: Sheng-Jia Sheu, New Taipei (TW); Chien-Chang Pei, New Taipei (TW)

(73) Assignee: Everlight Electronics Co., Ltd., New Taipei (TW)

( * ) Notice: Subject to any disclaimer, the term of this patent is extended or adjusted under 35 U.S.C. 154(b) by 0 days.

This patent is subject to a terminal disclaimer.

(21) Appl. No.: 13/149,309

(22) Filed: May 31, 2011

(65) Prior Publication Data
US 2011/0254025 A1    Oct. 20, 2011

Related U.S. Application Data

(63) Continuation of application No. 12/076,487, filed on Mar. 19, 2008, now Pat. No. 7,982,308.

(30) Foreign Application Priority Data
Dec. 31, 2007    (TW) ............................... 96222647 U

(51) Int. Cl.
*H01L 23/34* (2006.01)
(52) U.S. Cl. . 257/726; 257/688; 257/785; 257/E33.062; 257/E33.066; 257/E33.071; 174/562; 174/563; 439/358

(58) Field of Classification Search .................. 257/688, 257/726, 785, E33.071, E33.062, E33.066; 174/545, 555, 561, 562, 563; 439/55, 358
See application file for complete search history.

(56) References Cited

U.S. PATENT DOCUMENTS

| | | | | |
|---|---|---|---|---|
| 5,271,148 A * | 12/1993 | Desrochers et al. | ............ | 29/827 |
| 6,335,548 B1 | 1/2002 | Roberts et al. | | |
| 6,428,189 B1 * | 8/2002 | Hochstein | ...................... | 362/373 |
| 7,070,418 B1 * | 7/2006 | Wang | ................. | 439/56 |
| 7,210,833 B2 * | 5/2007 | Gasquet et | .................... | 362/548 |
| 7,982,308 B2 * | 7/2011 | Sheu et al. | .................... | 257/727 |
| 2003/0218417 A1 * | 11/2003 | Chin | ............................. | 313/498 |
| 2008/0224166 A1 | 9/2008 | Glovatsky et al. | | |

* cited by examiner

*Primary Examiner* — Eduardo A Rodela
(74) *Attorney, Agent, or Firm* — Han IP Law PLLC; Andy M. Han

(57) ABSTRACT

A light-emitting diode packaging structure comprises a light-emitting diode and first and second metal plates on which the light-emitting diode is mounted. The light-emitting diodes includes first and second electrode leads, the second electrode lead having first and second contact surfaces on an outer edge of the second electrode lead. The first metal plate includes at least one clamping portion that clamps and fixes the first electrode lead on the first metal plate. The second metal plate includes at least first and second clamping portions. The first contact surface of the second electrode lead contacts the first clamping portion, and the second contact surface of the second electrode lead contacts the second clamping portion, such that the light-emitting diode is fixed on the second metal plate in at least two dimensions parallel to a primary surface of the second metal plate on which the light-emitting diodes is mounted.

18 Claims, 11 Drawing Sheets

LIGHT-EMITTING DIODE PACKAGING STRUCTURE AND MODULE AND ASSEMBLING METHOD THEREOF

CROSS-REFERENCE TO RELATED PATENT APPLICATIONS

This application claims the priority benefit of U.S. patent application Ser. No. 12/076,487, filed Mar. 19, 2008 and claiming priority to Taiwan Patent Application Number 099222647, filed Dec. 31, 2007, which applications are herein incorporated in their entirety by reference.

BACKGROUND

1. Technical Field

The present disclosure relates to a light-emitting diode packaging structure, a packaging module and the assembling method thereof, and more particularly, to a light-emitting diode packaging structure, a packaging module and the assembling method for assembling at least one light-emitting diode without using welding.

2. Description of Related Art

A light emitting diode (LED) has a low working voltage, low power loss, high light emitting efficiency, short response time, pure light color, solid structure, high impact resistance, high vibration endurance, stable performance, light weight, small volume and low cost. The promotion of the technology has helped to increase the brightness of the LED, and LEDs are being used in increasingly diverse applications such as large-scale display screens, status indication, symbol lighting, signal displays, backlight of a liquid crystal display (LCD) and lighting in car.

Conventional LEDs may be bonded on a metal substrate for circuit connection. When bonding the LED, the LED leads may be welded to the metal substrate. However, the temperature of the LED is too high during welding, and the LED chip may be burned out. Further, when the LED is welded to the metal substrate, it is difficult that the LED positions to the metal substrate. Therefore, there are problems when the LED is welded on the metal substrate.

SUMMARY

Therefore, an objective of the present disclosure is to provide a light-emitting diode packaging structure, a packaging module and the assembling method thereof to assemble the LED on the metal plates without using welding.

Another objective of the present disclosure is to provide a light-emitting diode packaging structure, a packaging module and the assembling method thereof to position the LED on the metal plates precisely.

In one aspect, a light-emitting diode packaging structure may comprise: a light-emitting diode including a first electrode lead and a second electrode lead, the second electrode lead having a first contact surface and a second contact surface on an outer edge of the second electrode lead; a first metal plate having a primary surface on which the first electrode lead is mounted, the first metal plate including a third clamping portion and a fourth clamping portion that clamp and fix the first electrode lead on the first metal plate; and a second metal plate having a primary surface on which the second electrode lead is mounted, the second metal plate including at least a first clamping portion and a second clamping portion, the first contact surface of the second electrode lead contacting the first clamping portion and the second contact surface of the second electrode lead contacting the second clamping portion such that the light-emitting diode is fixed on the second metal plate in at least two dimensions parallel to the primary surface of the second metal plate.

In one embodiment, the first clamping portion and the second clamping portion may be arranged such that an angle is formed between the first clamping portion and the second clamping portion. The angle may be 90 degrees.

In one embodiment, the first electrode lead may have a third contact surface and a fourth contact surface on an outer edge of the first electrode lead. The third contact surface of the first electrode lead may contact the third clamping portion and the fourth contact surface of the first electrode lead may contact the fourth clamping portion such that the light-emitting diode is fixed on the first metal plate in at least two dimensions parallel to the primary surface of the first metal plate.

In one embodiment, the electrode leads may be made of Al, Cu or Fe.

In one embodiment, each of the clamping portions may be formed as one piece together with the respective metal plate.

In one embodiment, each of the electrode leads may include at least one position hole. Each of the metal plates may further include at least one holding portion corresponding to the position hole to pass through the position hole and hold the respective electrode lead thereon. Each holding portion may be formed as one piece together with the respective metal plate.

In one embodiment, the light-emitting diode packaging structure may further comprise an electrically conductive bonding material disposed between at least one of the electrode leads and the respective metal plate. The electrically conductive bonding material may be an electrically conductive glue or an Ag glue.

In another aspect, a light-emitting diode packaging module may comprise: a plurality of light-emitting diodes, each of the light-emitting diodes respectively including a first electrode lead and a second electrode lead; a first metal plate having a primary surface on which the first electrode leads of the light-emitting diodes are mounted, the first metal plate including a plurality of first clamping portions such that at least one of the first clamping portions corresponds to the first electrode lead of each of the light-emitting diodes to clamp and fix the first electrode leads of the light-emitting diodes on the first metal plate; and a second metal plate having a primary surface on which the second electrode leads of the light-emitting diodes are mounted, the second metal plate including a plurality of second clamping portions such that at least two of the second clamping portions correspond to the second electrode lead of at least one of the light-emitting diodes to clamp and fix the second electrode leads of the light-emitting diodes on the second metal plate.

In one embodiment, the at least two of the second clamping portions may be arranged such that a first angle is formed between the at least two of the second clamping portions. The first angle may be 90 degrees.

In one embodiment, at least two of the first clamping portions of the first metal plate may correspond to the first electrode lead of one of the light-emitting diodes to clamp and fix the one of the light-emitting diodes. The at least two of the first clamping portions may be arranged such that a second angle is formed between the at least two of the first clamping portions. The second angle may be 90 degrees.

In one embodiment, the metal plates may be allowed to be bent to form a predetermined three-dimensional structure.

In one embodiment, the clamping portions of each of the metal plates may be formed as one piece together with the respective metal plate.

In one embodiment, each of the electrode leads may include at least one position hole. Each of the metal plates may further include a plurality of holding portions each of which corresponding to the position hole of a respective one of the electrode leads to pass through the position holes and hold the electrode leads thereon. The holding portions of each of the metal plates may be formed as one piece together with the respective metal plate.

In one embodiment, the light-emitting diode packaging module may further comprise an electrically conductive bonding material disposed between at least one of the electrode leads and the respective metal plate.

Therefore, with the application of the light-emitting diode packaging structure, the packaging module and the assembling method thereof of the present disclosure, the LED can be mounted and positioned on the metal plates without being welded. Therefore, the bonding between the electrode leads and the metal plates can be released, thereby preventing damage to the LED.

BRIEF DESCRIPTION OF THE DRAWINGS

The foregoing aspects and many of the attendant advantages of this disclosure will become more readily appreciated as the same becomes better understood by reference to the following detailed description, when taken in conjunction with the accompanying drawings, wherein:

FIG. 1A to FIG. 10 are three-dimensional views showing a light-emitting diode packaging structure according to a first embodiment of the present disclosure;

FIG. 2 is a three-dimensional view showing a light-emitting diode packaging module according to a second embodiment of the present disclosure;

FIG. 4 is a top view showing a light-emitting diode packaging structure according to a fourth embodiment of the present disclosure;

FIG. 6 is a three-dimensional view showing a light-emitting diode packaging module according to a sixth embodiment of the present disclosure.

DESCRIPTION OF PREFERRED EMBODIMENTS

In order to make the illustration of the present disclosure more explicit and complete, the following description is stated with reference to FIG. 1 through FIG. 6.

Figure 1A:
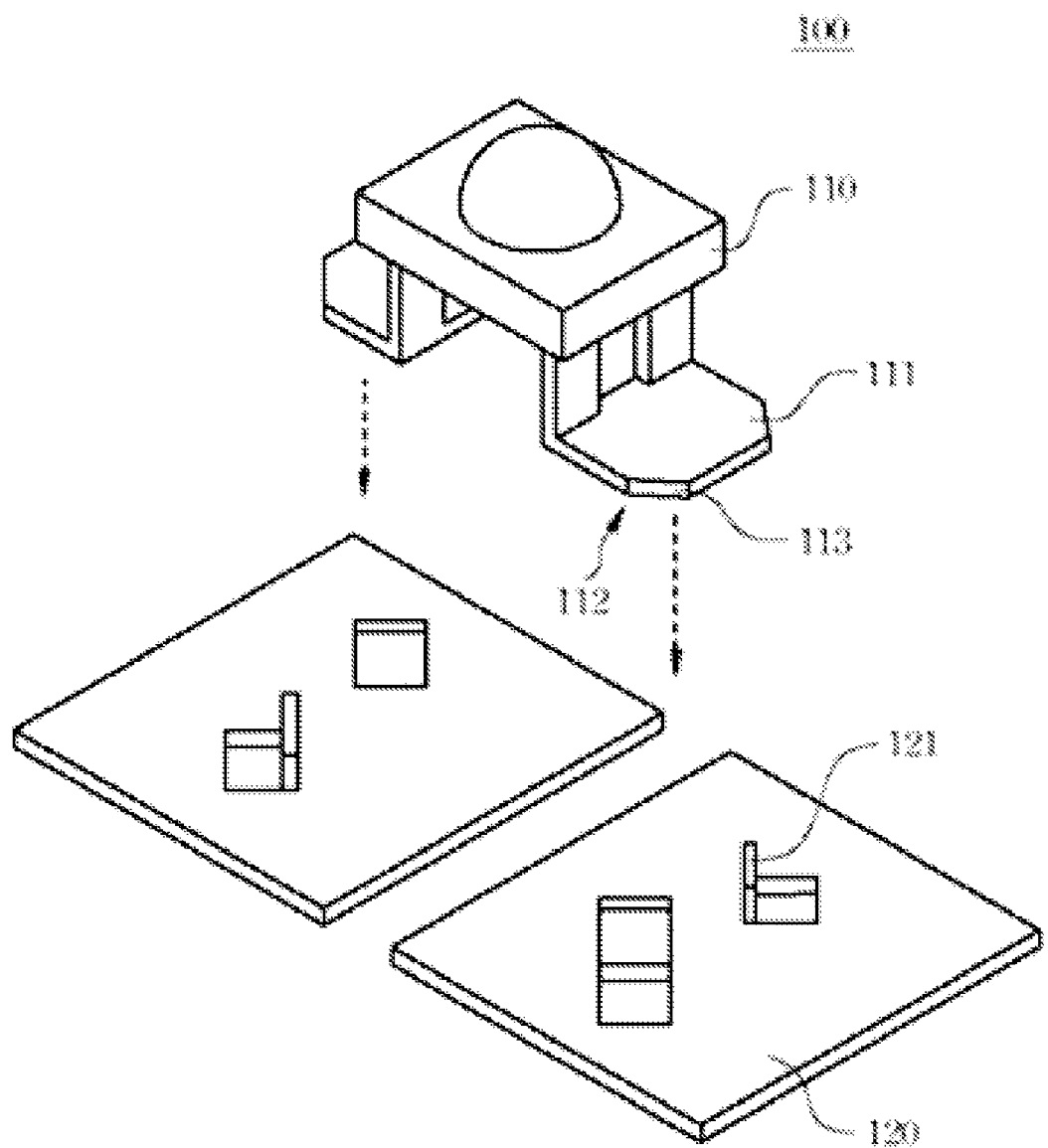
Figure 1B:
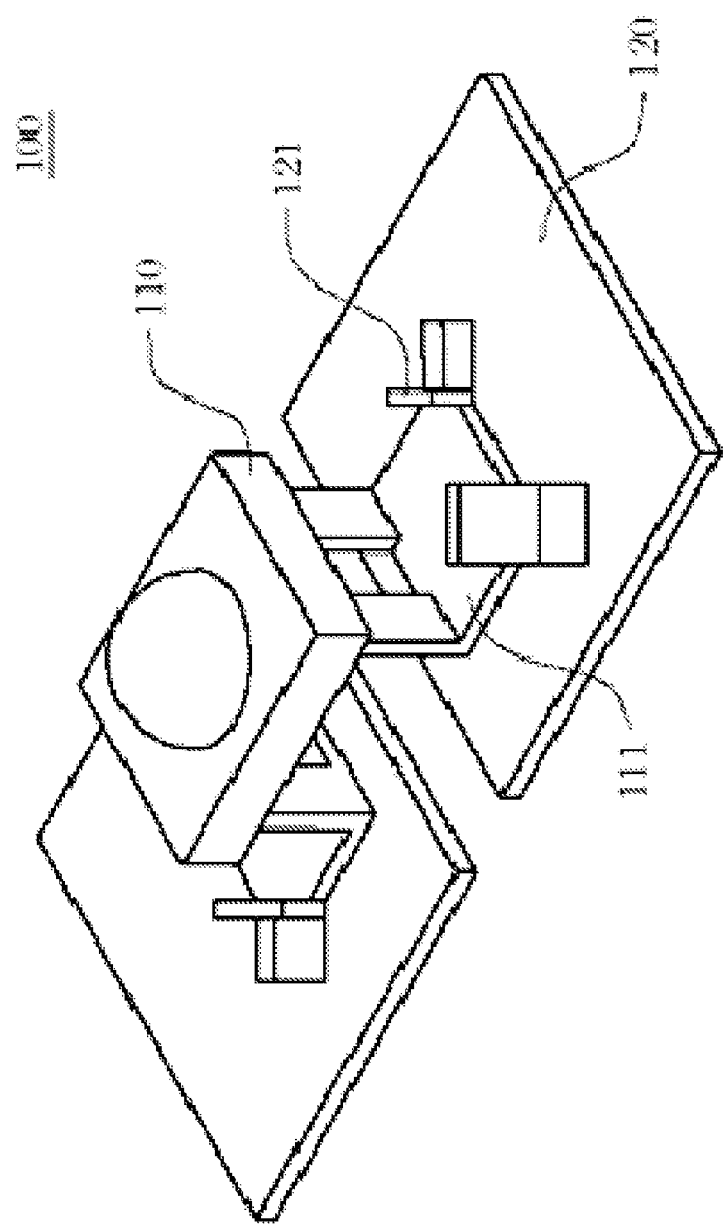
Figure 1C:
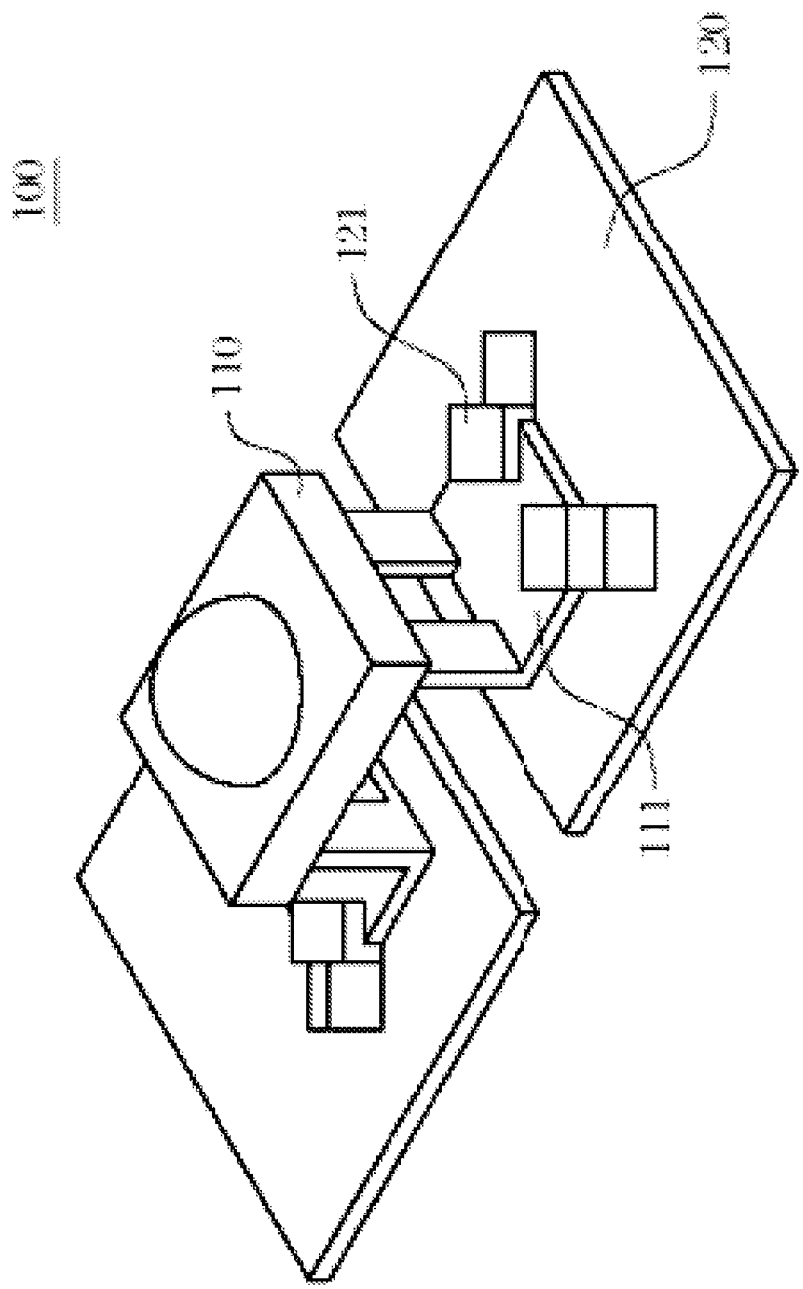

Refer to FIG. 1A, FIG. 1B and FIG. 10. FIG. 1A, FIG. 1B and FIG. 10 are three-dimensional views showing a light-emitting diode packaging structure according to a first embodiment of the present disclosure. The light-emitting diode packaging structure 100 comprises a light-emitting diode (LED) 110 and two metal plates 120. The LED 110 is mounted on the metal plates 120 for electrical connection or heat dissipation.

Refer to FIG. 1A, FIG. 1B and FIG. 1C again. The LED 110 of the present embodiment includes two electrode leads 111 mounted on the metal plates 120 respectively in a one-to-one manner. Each of the electrode leads 111 is made of metal material, such as Al, Cu or Fe. The metal material preferably has great heat conduction. Each of the electrode leads 111 has a bonding surface 112 to be bonded on the metal plates 120. The metal plates 120 of the present embodiment are mounted to the electrode leads 111 respectively in a one-to-one manner for electrical connection or heat dissipation. Each of the metal plates 120 includes at least one clamping portion 121 to clamp and fix the electrode leads 111 thereon. Therefore, the electrode leads 111 of the LED 110 are mounted on the metal plates 120, thereby forming the light-emitting diode packaging structure 100. The clamping portion 121 of each of the metal plates 120 is positioned to the electrode leads 111. Therefore, the electrode leads 111 of the LED 110 can be positioned on the metal plates 120 by the clamping portion 121. The clamping portion 121 of each of the metal plates 120 may be formed as one piece together with the metal plates 120. For example, the clamping portion 121 may be formed on each of the metal plates 120 by a method of punching. The clamping portion 121 is bent from the outside to the inside of each of the electrode leads 111, thereby clamping the electrode leads 111 of the LED 110 on the metal plates 120 respectively. Therefore, the LED 110 can be bonded on the metal plates 120 firmly without using welding.

It is worth mentioning that an electrically conductive bonding material (such as an electrically conductive glue or a Ag glue) is allowed to be formed between each of the electrode leads 111 of the LED 110 and each of the metal plates 120 to enhance the bonding effect.

In the present embodiment, each of the electrode leads 111 has two contact surfaces 113 formed on the outer edge thereof, and each of the metal plates 120 may include two clamping portions 121 to contact the contact surfaces 113 respectively. At this time, the bonding surface 112 of each of the electrode leads 111 touches each of the metal plates 120, and the contact surfaces 113 touch the clamping portions 121. Therefore, each of the electrode leads 111 can be held and positioned by the clamping portions 121 of the metal plates 120. Further, there is preferably an angle (such as 90 degrees) formed between the clamping portions 121 of the metal plates 120 of the present embodiment, thereby making it easier to position each of the electrode leads 111 thereon.

Refer to FIG. 1A, FIG. 1B and FIG. 10 again. When assembling the light-emitting diode packaging structure 100, the electrode leads 111 are held on the metal plates 120 respectively in a one-to-one manner. At this time, the clamping portion 121 of the metal plates 120 can hold and position the electrode leads 111. Next, at least one clamping portion 121 is bent to clamp and fix the electrode leads 111 on the metal plates 120 respectively, thereby resulting in the LED packaging structure 100.

Therefore, the light-emitting diode packaging structure 100 of the present embodiment can be achieved without welding, and the assembling method thereof is simple, thereby enhancing the manufacturing yield. Further, the clamping portion 121 can position the LED 110, thereby raising the positioning accuracy and assembling efficiency.

Figure 2:
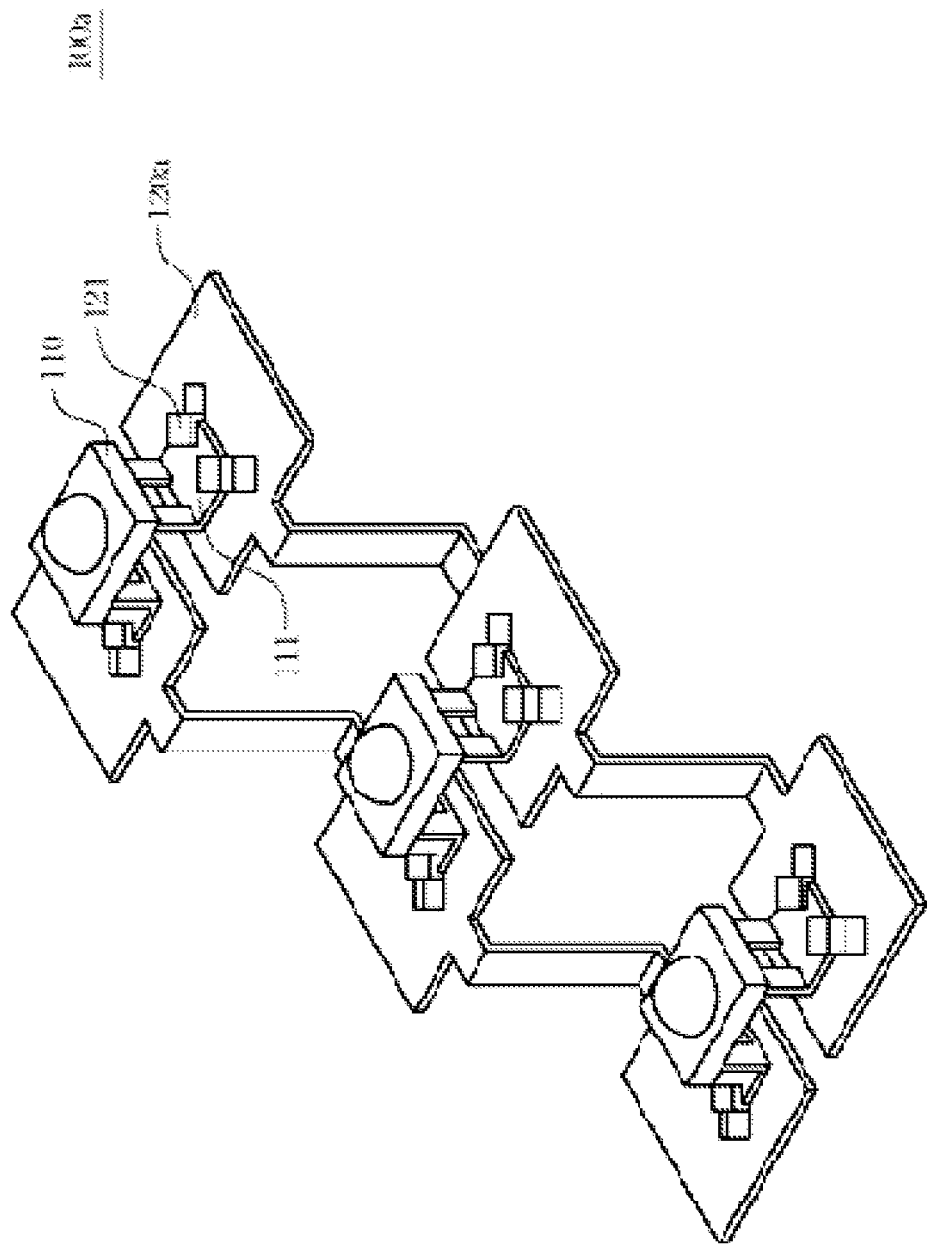

Refer to FIG. 2. FIG. 2 is a three-dimensional view showing a light-emitting diode packaging module according to a second embodiment of the present disclosure. Some reference numerals shown in the first embodiment are used in the second embodiment of the present disclosure. The construction of the second embodiment is similar to that in the first embodiment with respect to configuration and function, and thus is not stated in detail herein.

Referring again to FIG. 2, in comparison with the first embodiment, a plurality of LEDs 110 of the second embodiment are mounted on the two metal plates 120a, thereby forming a light-emitting diode packaging module 100a. At this time, each of the metal plates 120a includes a plurality of clamping portions 121 to clamp and fix the electrode leads 111 of the LEDs 110 thereon. Further, the metal plates 120a are allowed to bend to form a predetermined three-dimensional structure according to the actual requirement when using the light-emitting diode packaging module 100a of the second embodiment.

Figure 3A:
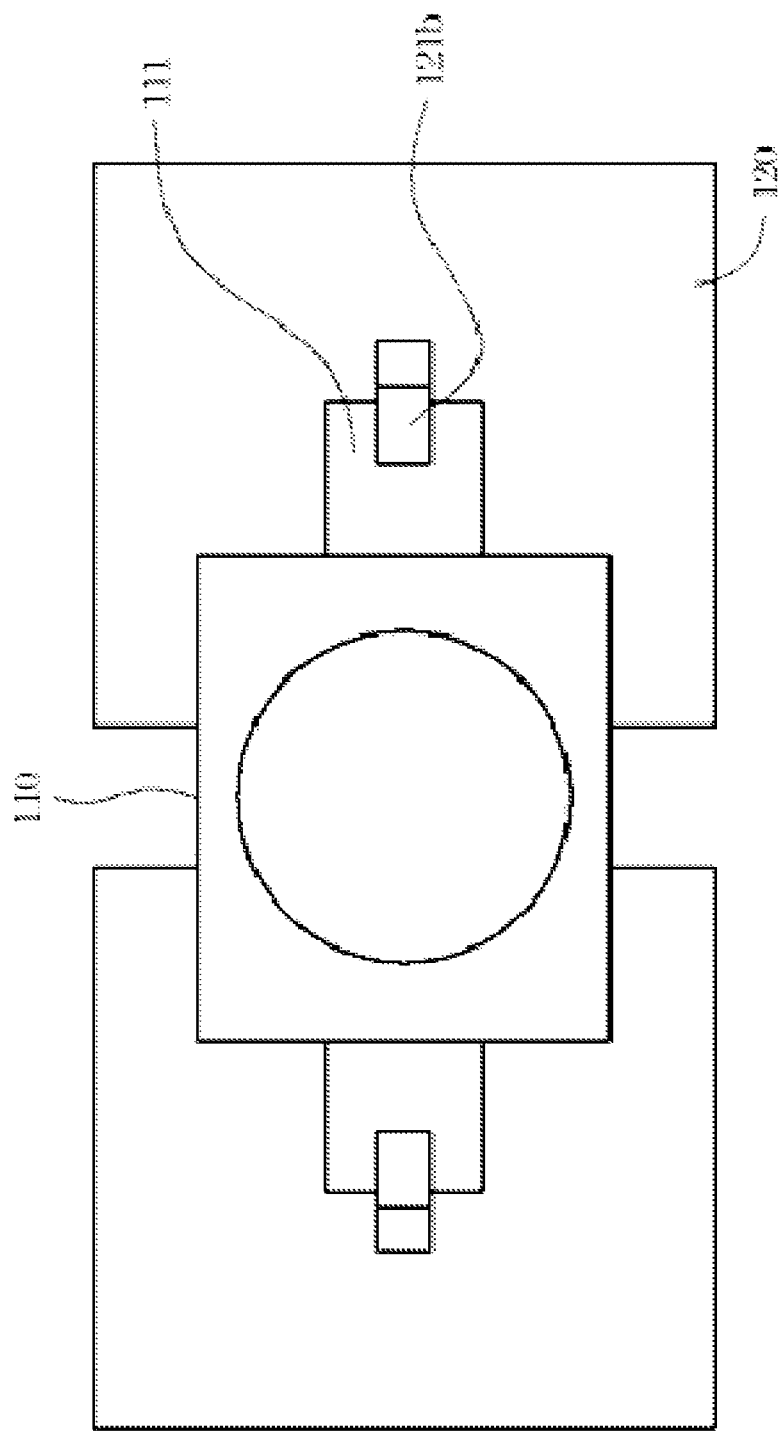
FIG. 3A is a top view showing a light-emitting diode packaging structure according to a third embodiment of the present disclosure.
Figure 3B:
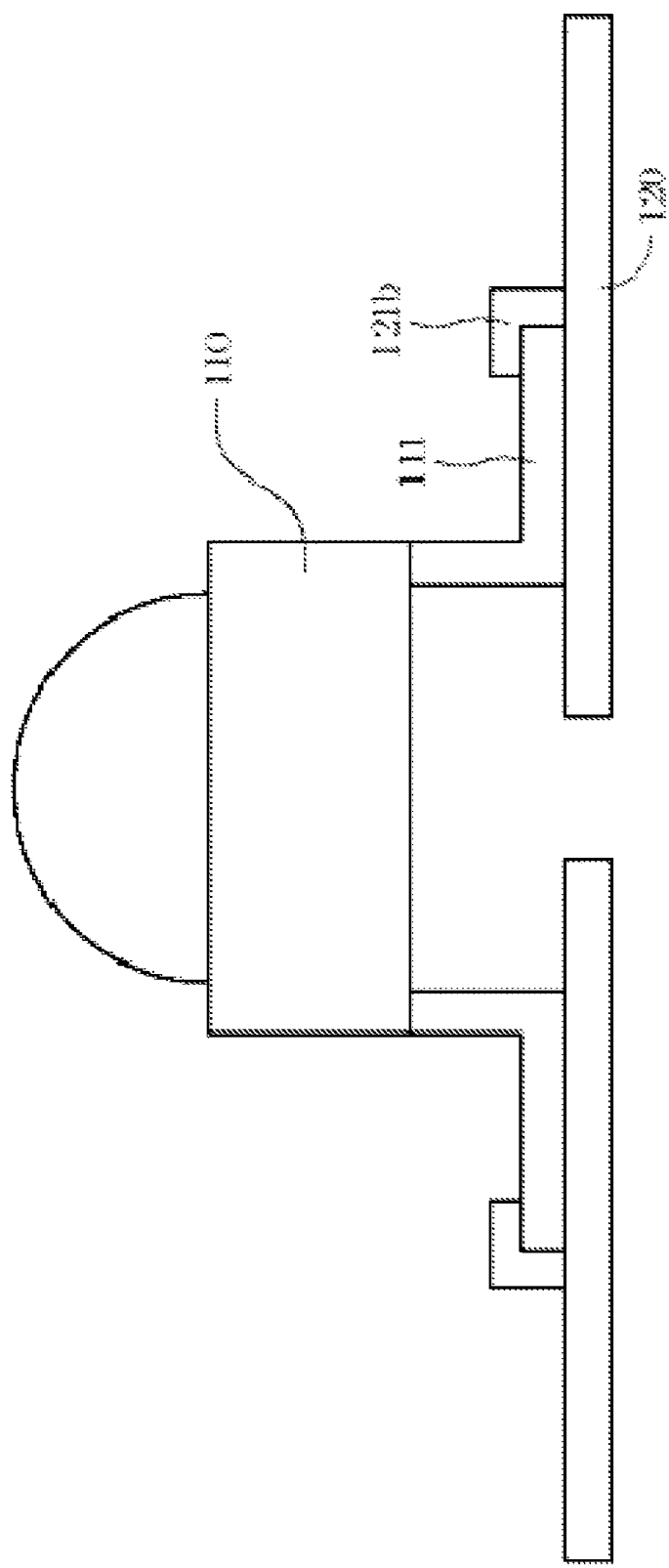
FIG. 3B is a side view showing a light-emitting diode packaging structure according to a third embodiment of the present disclosure.

Refer to FIG. 3A and FIG. 3B. FIG. 3A is a top view showing a light-emitting diode packaging structure according to a third embodiment of the present disclosure. FIG. 3B is a side view showing a light-emitting diode packaging structure according to a third embodiment of the present disclosure. Some reference numerals shown in the first embodiment are used in the third embodiment of the present disclosure. The construction of the third embodiment is similar to that in the first embodiment with respect to configuration and function, and thus is not stated in detail herein.

Referring again to FIG. 3A and FIG. 3B, in comparison with the first embodiment, each of the metal plates 120 includes a clamping portion 121b to clamp and fix the electrode leads 111 thereon. Therefore, the light-emitting diode packaging structure 100 can be achieved without welding, thereby raising the assembling efficiency.

Figure 4:
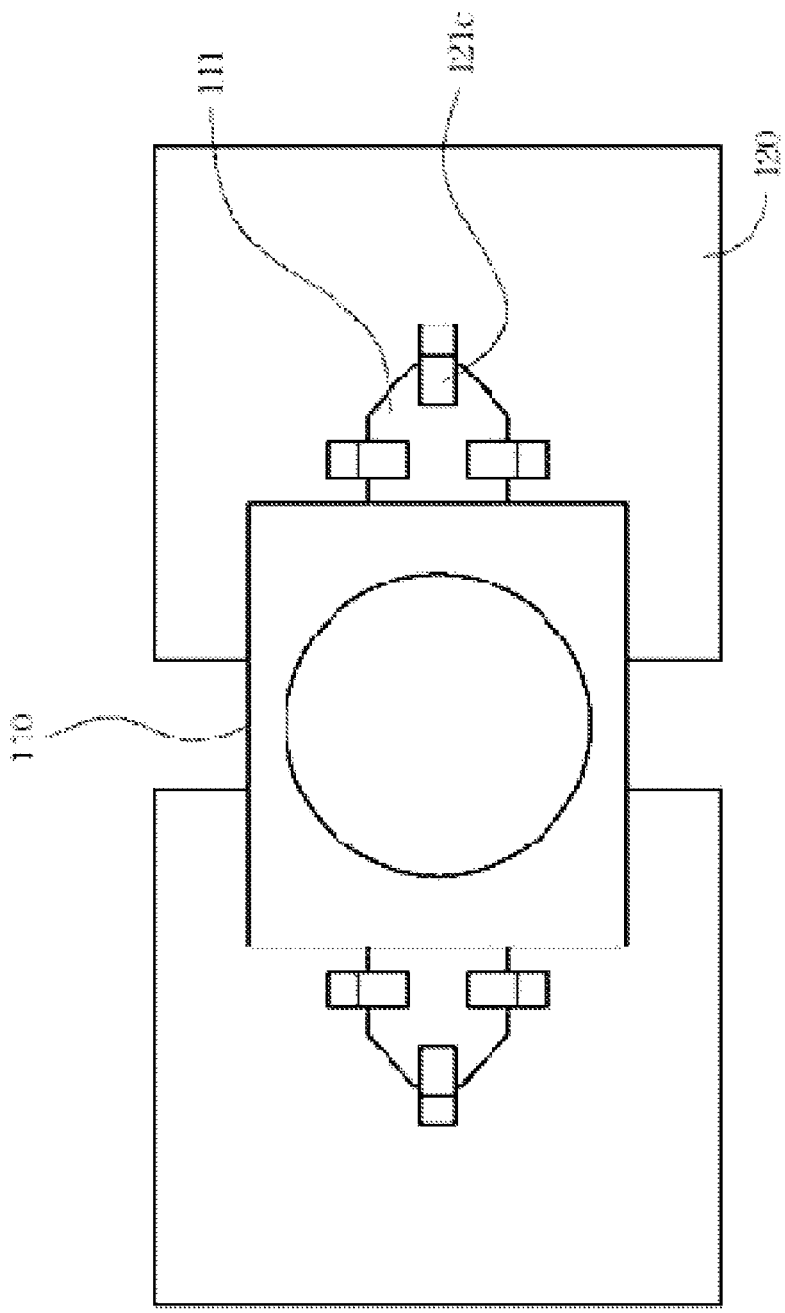

Refer to FIG. 4. FIG. 4 is a top view showing a light-emitting diode packaging structure according to a fourth embodiment of the present disclosure. Some reference numerals shown in the first embodiment are used in the fourth embodiment of the present disclosure. The construction of the fourth embodiment is similar to that in the first embodiment with respect to configuration and function, and thus is not stated in detail herein.

Referring again to FIG. 4, in comparison with the first embodiment, each of the metal plates 120 of the fourth embodiment includes three clamping portion 121c to clamp and fix the electrode leads 111 thereon. Therefore, the electrode leads 111 of the LED 110 can be held on the metal plates 120 firmly, thereby raising the bonding stability and positioning accuracy.

Figure 5A:
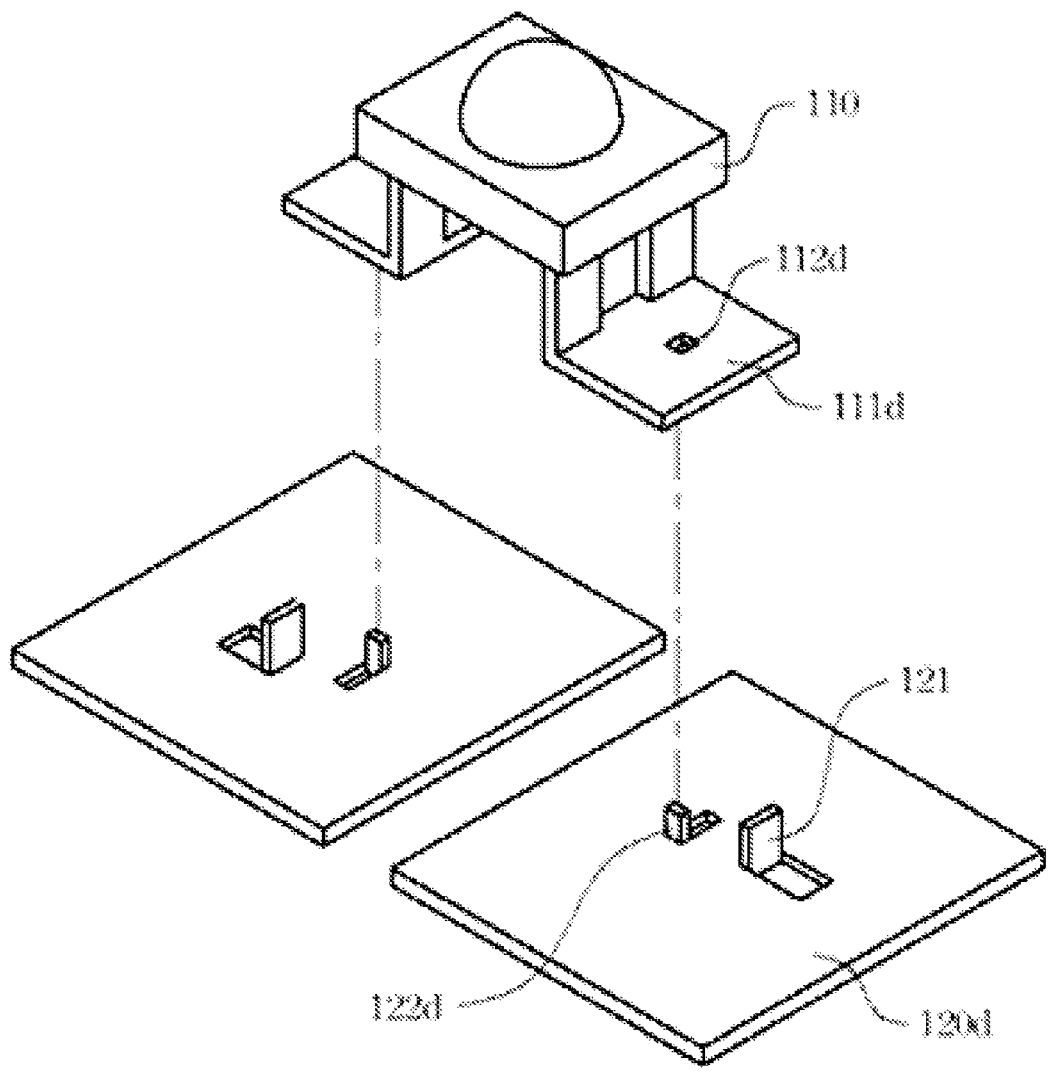
FIG. 5A to FIG. 5C are three-dimensional views showing a light-emitting diode packaging structure according to a fifth embodiment of the present disclosure.
Figure 5B:
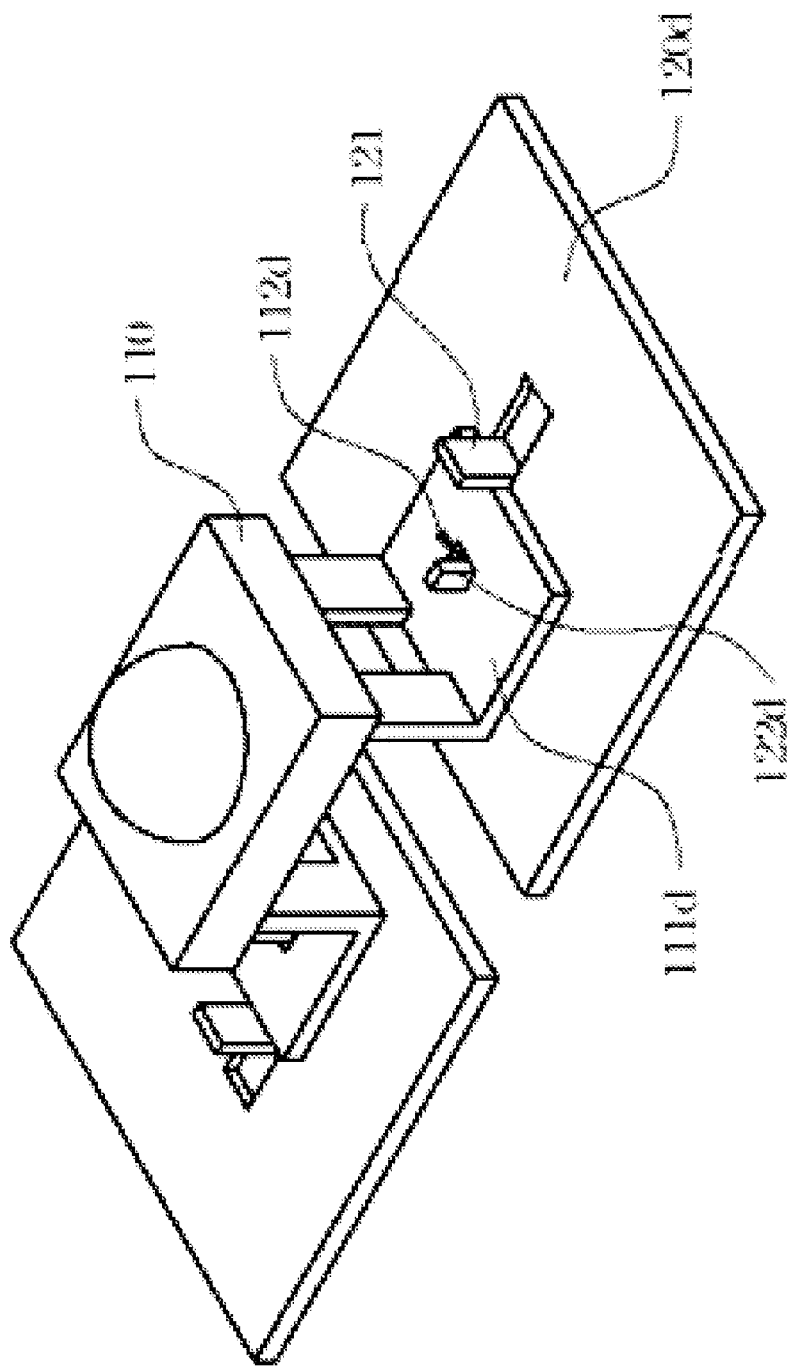
Figure 5C:
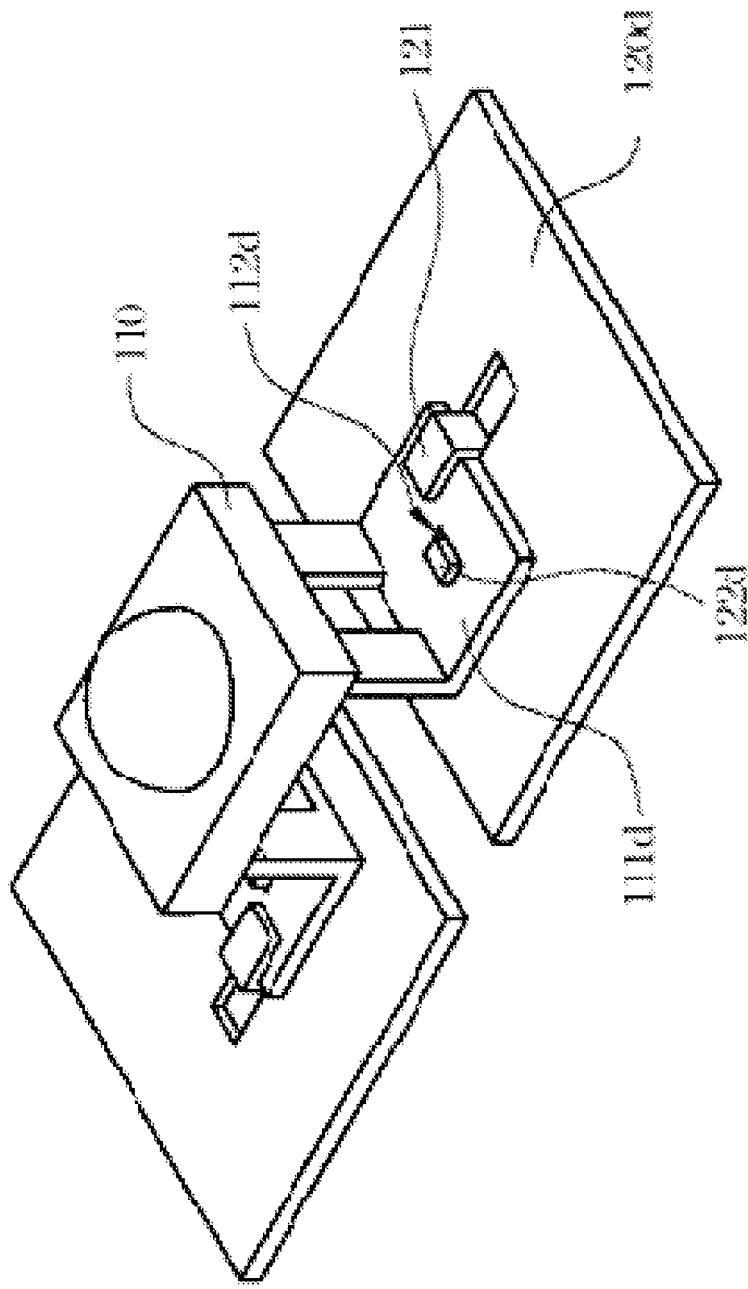

Refer to FIG. 5A, FIG. 5B and FIG. 5C. FIG. 5A, FIG. 5B and FIG. 5C are three-dimensional views showing a light-emitting diode packaging structure according to a fifth embodiment of the present disclosure. Some reference numerals shown in the first embodiment are used in the fifth embodiment of the present disclosure. The construction of the fifth embodiment is similar to that in the first embodiment with respect to configuration and function, and thus is not stated in detail herein.

Referring again to FIG. 5A, FIG. 5B and FIG. 5C, in comparison with the first embodiment, each of the electrode leads 111d of the LED 110 of the fifth embodiment at least one position hole 112d, and each of the metal plates 120d further includes at least one holding portion 122d corresponding to the position hole 112d for passing through the position hole 112d and holding the electrode leads 111d of the LED 110 thereon. The holding portion 122d of each of the metal plates 120 may be formed as one piece together with the metal plates 120. For example, the clamping portion 121 may be formed on each of the metal plates 120 by a punching method. The holding portion 122d and the clamping portion 121 of each of the metal plates 120 are bent to clamp and hold the electrode leads 111d of the LED 110 on the metal plates 120 respectively. Therefore, the LED 110 of the fifth embodiment can be bonded on the metal plates 120 firmly without using welding.

Figure 6:
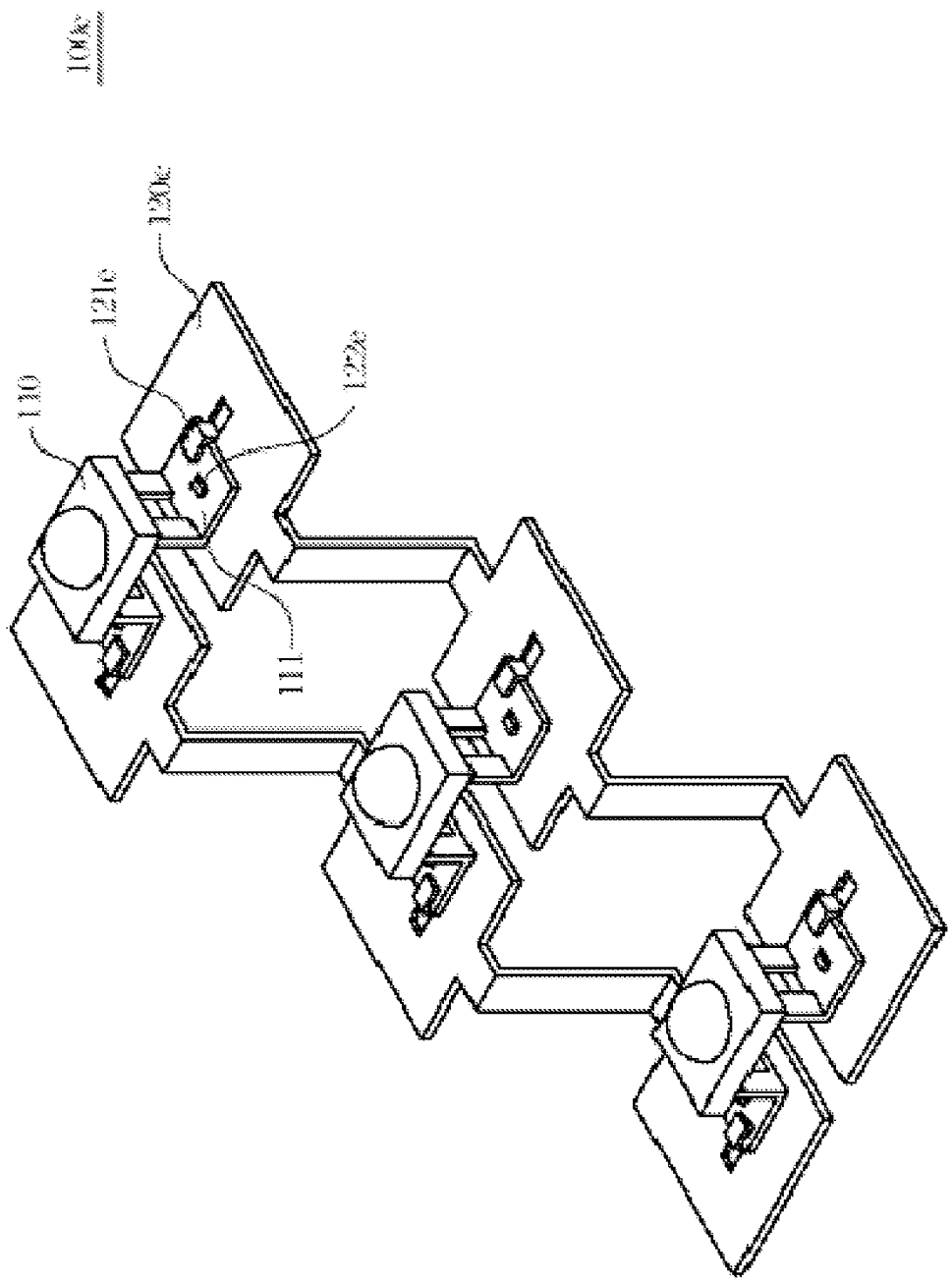

Refer to FIG. 6. FIG. 6 is a three-dimensional view showing a light-emitting diode packaging module according to a sixth embodiment of the present disclosure. Some reference numerals shown in the fifth embodiment are used in the sixth embodiment of the present disclosure. The construction of the sixth embodiment is similar to that in the fifth embodiment with respect to configuration and function, and thus is not stated in detail herein.

Referring again to FIG. 6, in comparison with the fifth embodiment, a plurality of LEDs 110 may be mounted on the two metal plates 120e of the sixth embodiment, thereby forming a light-emitting diode packaging module 100e. At this time, each of the metal plates 120e includes a plurality of clamping portion 121e and a plurality of holding portion 122e to clamp and hold the electrode leads 111 of the LEDs 110 thereon. Further, the metal plates 120e can be bent to form a predetermined three-dimensional structure according to the actual requirement when using the light-emitting diode packaging module 100e of the sixth embodiment.

Therefore, the LED can be mounted on the metal plates by the simple assembling method of the present disclosure without using welding. Further, during the assembling process, the electrode leads of the LED are mounted to the metal plates by mechanical method. Therefore, in comparison with the welding method, the bonding between the electrode leads and the metal plates can be released without damaging the LED, and the LED can be reused.

As is understood by a person skilled in the art, the foregoing embodiments of the present disclosure are strengths of the present disclosure rather than limiting of the present disclosure. It is intended to cover various modifications and similar arrangements included within the spirit and scope of the appended claims, the scope of which should be accorded the broadest interpretation so as to encompass all such modifications and similar structure.

What is claimed is:

1. A light-emitting diode packaging structure, comprising:
a light-emitting diode including a first electrode lead and a second electrode lead, the second electrode lead having a first contact surface and a second contact surface on an outer edge of the second electrode lead;
a first metal plate having a primary surface on which the first electrode lead is mounted, the first metal plate including a third clamping portion and a fourth clamping portion that clamp and fix the first electrode lead on the first metal plate; and
a second metal plate having a primary surface on which the second electrode lead is mounted, the second metal plate including at least a first clamping portion and a second clamping portion, the first contact surface of the second electrode lead contacting the first clamping portion and the second contact surface of the second electrode lead contacting the second clamping portion such that the light-emitting diode is fixed on the second metal plate in at least two dimensions parallel to the primary surface of the second metal plate,
wherein each of the electrode leads includes at least one position hole, and wherein each of the metal plates further includes at least one holding portion corresponding to the position hole to pass through the position hole and hold the respective electrode lead thereon.

2. The light-emitting diode packaging structure as recited in claim 1, wherein the first clamping portion and the second clamping portion are arranged such that an angle is formed between the first clamping portion and the second clamping portion.

3. The light-emitting diode packaging structure as recited in claim 2, wherein the angle is 90 degrees.

4. The light-emitting diode packaging structure as recited in claim 1, wherein the first electrode lead has a third contact surface and a fourth contact surface on an outer edge of the first electrode lead, the third contact surface of the first electrode lead contacting the third clamping portion and the fourth contact surface of the first electrode lead contacting the fourth clamping portion such that the light-emitting diode is fixed on the first metal plate in at least two dimensions parallel to the primary surface of the first metal plate.

5. The light-emitting diode packaging structure as recited in claim 1, wherein the electrode leads are made of Al, Cu or Fe.

6. The light-emitting diode packaging structure as recited in claim 1, wherein each of the clamping portions is formed as one piece together with the respective metal plate.

7. The light-emitting diode packaging structure as recited in claim 1, wherein each holding portion is formed as one piece together with the respective metal plate.

8. The light-emitting diode packaging structure as recited in claim 1, further comprising an electrically conductive bonding material disposed between at least one of the electrode leads and the respective metal plate.

9. The light-emitting diode packaging structure as recited in claim 8, wherein the electrically conductive bonding material is an electrically conductive glue or an Ag glue.

10. A light-emitting diode packaging module, comprising:
a plurality of light-emitting diodes, each of the light-emitting diodes respectively including a first electrode lead and a second electrode lead;
a first metal plate having a primary surface on which the first electrode leads of the light-emitting diodes are mounted, the first metal plate including a plurality of first clamping portions such that at least one of the first clamping portions corresponds to the first electrode lead of each of the light-emitting diodes to clamp and fix the first electrode leads of the light-emitting diodes on the first metal plate; and
a second metal plate having a primary surface on which the second electrode leads of the light-emitting diodes are mounted, the second metal plate including a plurality of second clamping portions such that at least two of the second clamping portions correspond to the second electrode lead of at least one of the light-emitting diodes to clamp and fix the second electrode leads of the light-emitting diodes on the second metal plate,
wherein each of the electrode leads includes at least one position hole, and wherein each of the metal plates further includes a plurality of holding portions each of which corresponding to the position hole of a respective one of the electrode leads to pass through the position holes and hold the electrode leads thereon.

11. The light-emitting diode packaging module as recited in claim 10, wherein the at least two of the second clamping portions are arranged such that a first angle is formed between the at least two of the second clamping portions.

12. The light-emitting diode packaging module as recited in claim 11, wherein the first angle is 90 degrees.

13. The light-emitting diode packaging module as recited in claim 10, wherein at least two of the first clamping portions of the first metal plate correspond to the first electrode lead of one of the light-emitting diodes to clamp and fix the one of the light-emitting diodes, wherein the at least two of the first clamping portions are arranged such that a second angle is formed between the at least two of the first clamping portions.

14. The light-emitting diode packaging module as recited in claim 13, wherein the second angle is 90 degrees.

15. The light-emitting diode packaging module as recited in claim 10, wherein the metal plates are allowed to be bent to form a predetermined three-dimensional structure.

16. The light-emitting diode packaging module as recited in claim 10, wherein the clamping portions of each of the metal plates are formed as one piece together with the respective metal plate.

17. The light-emitting diode packaging module as recited in claim 10, wherein the holding portions of each of the metal plates are formed as one piece together with the respective metal plate.

18. The light-emitting diode packaging module as recited in claim 10, further comprising an electrically conductive bonding material disposed between at least one of the electrode leads and the respective metal plate.

* * * * *